(12) United States Patent
Wilm

(10) Patent No.: US 9,373,759 B2
(45) Date of Patent: Jun. 21, 2016

(54) LIGHT-EMITTING SEMICONDUCTOR COMPONENT

(71) Applicant: OSRAM Opto Semiconductors GmbH, Regensburg (DE)

(72) Inventor: Alexander Wilm, Regensburg (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 14/430,192

(22) PCT Filed: Sep. 24, 2013

(86) PCT No.: PCT/EP2013/069814
§ 371 (c)(1),
(2) Date: Mar. 20, 2015

(87) PCT Pub. No.: WO2014/048906
PCT Pub. Date: Apr. 3, 2014

(65) Prior Publication Data
US 2015/0243855 A1 Aug. 27, 2015

(30) Foreign Application Priority Data

Sep. 26, 2012 (DE) .......................... 10 2012 109 109
Nov. 19, 2012 (DE) .......................... 10 2012 111 123

(51) Int. Cl.
*H01L 33/00* (2010.01)
*H01L 33/50* (2010.01)
(Continued)

(52) U.S. Cl.
CPC .............. *H01L 33/505* (2013.01); *H01L 33/46* (2013.01); *H01L 33/486* (2013.01);
(Continued)

(58) Field of Classification Search
None
See application file for complete search history.

(56) References Cited

U.S. PATENT DOCUMENTS 6,616,862 B2    9/2003  Srivastava et al.
7,855,395 B2 *  12/2010 Lee .......................... H01L 33/52
                                                        257/100

(Continued)

FOREIGN PATENT DOCUMENTS

DE     10036940 A1    2/2002
DE     10147040 A1    4/2003

(Continued)

OTHER PUBLICATIONS

Schnitzer, I. et al, "30% External Quantum Efficiency from Surface Textured, Thin-Film Light-emitting Diodes", Appl. Phys. Lett. 63 (16), Oct. 18, 1993, pp. 2174-2176.

*Primary Examiner* — Reema Patel
(74) *Attorney, Agent, or Firm* — McDermott Will & Emery LLP

(57) ABSTRACT

The invention relates to a light-emitting semiconductor component, having: a light-emitting semiconductor chip (1) with an active region (11) which, in operation, emits light (31) having a first spectrum; a wavelength conversion element (2) which is positioned remote from the semiconductor chip (1), is downstream of the semiconductor chip (1) in the beam path of the light (31) having the first spectrum and converts the light (31) having the first spectrum at least partially into light (32) having a second spectrum; and a filter layer (3), which reflects at least a part (34) of a light (33) incident on the semiconductor component from the outside. The part (34) of the light (33) incident on the semiconductor component from the outside that is reflected by the filter layer (3) has a visible wavelength range and overlaps a color impression produced by the wavelength conversion element when the semiconductor component is in a switched-off state.

20 Claims, 3 Drawing Sheets

Figure 1A:
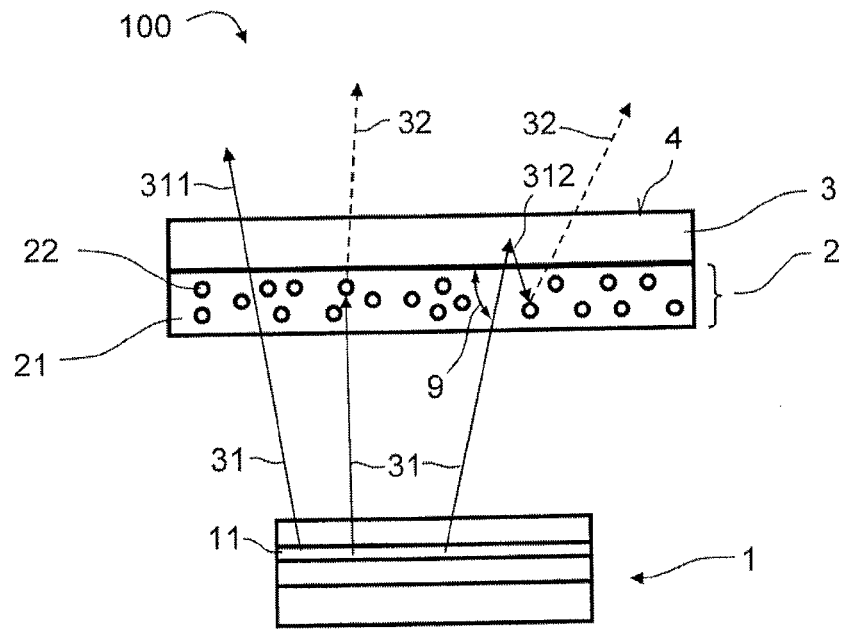

(51) Int. Cl.
*H01L 33/46* (2010.01)
*H01L 33/48* (2010.01)
*H01L 33/58* (2010.01)
*H01L 33/60* (2010.01)

(52) U.S. Cl.
CPC ........... *H01L 33/501* (2013.01); *H01L 33/507* (2013.01); *H01L 33/508* (2013.01); *H01L 33/58* (2013.01); *H01L 33/60* (2013.01)

(56) References Cited

U.S. PATENT DOCUMENTS

| | | |
|---|---|---|
| 2004/0062699 A1 | 4/2004 | Oshio |
| 2006/0171152 A1 | 8/2006 | Suehiro et al. |
| 2010/0012959 A1* | 1/2010 | Wilm ...................... H01L 33/50 257/98 |
| 2010/0072489 A1 | 3/2010 | McLaurin et al. |
| 2011/0012141 A1* | 1/2011 | Le Toquin ............. H01L 33/502 257/89 |
| 2012/0256223 A1* | 10/2012 | Washizu ................ H01L 33/501 257/98 |

FOREIGN PATENT DOCUMENTS

| | | |
|---|---|---|
| DE | 102006046199 A1 | 4/2008 |
| WO | 00/33390 A1 | 6/2000 |
| WO | 2004/068597 A2 | 8/2004 |
| WO | 2010/106478 A1 | 9/2010 |
| WO | 2011/007276 A1 | 1/2011 |
| WO | WO2011077548 A1 * | 6/2011 ............. H01L 33/50 |

* cited by examiner

LIGHT-EMITTING SEMICONDUCTOR COMPONENT

A light-emitting semiconductor component is specified.

In order to generate white light by means of a light-emitting diode chip, it is possible, for example, for a phosphor to be disposed downstream of a blue-emitting light-emitting diode chip, said phosphor converting a part of the blue light emitted by the light-emitting diode chip into yellow light. While the light-emitting diode chip with the phosphor thus has a white luminous appearance in the switched-on state, the phosphor in the case where the light-emitting diode chip is switched off produces a yellow color impression, which can be perceived as disturbing.

It is at least one object of specific embodiments to specify a semiconductor component comprising a wavelength conversion element in which an undesirable color impression can be reduced or avoided in a switched-off state.

This object is achieved by means of the subject matter comprising the features of the independent patent claim. Advantageous embodiments and developments of the subject matter are characterized in the dependent claims and are evident from the following description and the drawings.

In accordance with at least one embodiment, a semiconductor component comprises a semiconductor chip having an active region, which emits light having a first spectrum during operation. A wavelength conversion element is disposed downstream of the semiconductor chip in the beam path of the light having the first spectrum, said wavelength conversion element at least partly converting light having the first spectrum into light having a second spectrum. The wavelength conversion element is positioned in particular in a manner remote from the semiconductor chip. Furthermore, the semiconductor component comprises a filter layer, which reflects at least one part of light incident on the semiconductor component from outside.

In accordance with a further embodiment, the light incident on the semiconductor component from outside corresponds to light which is not emitted by the active region of the semiconductor chip. That can mean that the light incident on the semiconductor component from outside is ambient light, for example sunlight and/or light emitted by artificial light sources.

Here and hereinafter, "spectrum" or "partial spectrum" denotes a spectral distribution of light having at least one spectral component having one wavelength or a plurality of spectral components having a plurality of wavelengths and/or ranges of wavelengths. A first spectrum and a second spectrum are identical hereinafter if the spectral components of the first spectrum and of the second spectrum and the relative intensities thereof are identical, wherein the absolute intensity of the first spectrum can deviate from the absolute intensity of the second spectrum.

Furthermore, the feature "partly" in relation to the absorption, conversion and/or reflection of a spectrum relates to a partial spectrum of the spectrum, that is to say to a portion of the spectral components of said spectrum, and/or to a part of an intensity of the spectrum or of spectral components thereof.

Furthermore, "convert" can mean that the partial spectrum of the light having the first spectrum which is at least partly converted into light having the second spectrum by the wavelength conversion element and the second spectrum are not identical. That can mean, in particular, that the second spectrum has a spectral distribution that is different than the spectral distribution of the partial spectrum of the light having the first spectrum. In other words, the wavelength conversion element can have an absorption spectrum and an emission spectrum, wherein the absorption spectrum and the emission spectrum are not identical. In this case, the absorption spectrum comprises the partial spectrum of the light having the first spectrum and the emission spectrum comprises the second spectrum. Furthermore, the absorption spectrum and the emission spectrum can in each case comprise even further spectral components which are not contained in the partial spectrum of the light having the first spectrum or in the second spectrum.

If light having a specific wavelength is incident on the wavelength conversion element from outside or from the active region of the semiconductor chip and if the absorption spectrum of the wavelength conversion element comprises a spectral component having said specific wavelength, then the light having said specific wavelength is re-emitted in light having one or a plurality of other wavelengths which are different than said specific wavelength and which are contained in the emission spectrum. As a result, in particular in the case of light incident on the semiconductor component from outside, it can be possible that the wavelength conversion element, in a switched-off state of the semiconductor component, can produce for an observer, according to the absorption spectrum and the emission spectrum, a color impression which can be inherently undesirable. Said color impression can be undesirable for example by virtue of the fact that it can be different than the color impression of the light emitted during the operation of the semiconductor component.

In accordance with one particularly preferred embodiment, that part of the light incident from outside which is reflected by the filter layer comprises a visible wavelength range. In a switched-off state of the semiconductor component, that part of the light incident from outside which is reflected by the filter layer can thereby be superimposed on a color impression brought about by the wavelength conversion element. As a result, it can be possible that an external observer, upon viewing the wavelength conversion element with the filter layer, perceives a different color impression than said observer would perceive upon viewing the wavelength conversion element alone.

During the operation of the semiconductor component, by contrast, an external observer can perceive in particular light corresponding to a superimposition of that part of the light having the first spectrum which is not converted by the wavelength conversion element and the light having the second spectrum.

In particular, it can be advantageous if that part of the light incident on the semiconductor component from outside which is reflected by the filter layer together with the color impression brought about by the wavelength conversion element alone enables, as a result of superimposition, for an observer a color impression corresponding to the color impression of the light incident on the semiconductor component from outside and/or of the light emitted by the semiconductor component during operation.

In accordance with a further preferred embodiment, the filter layer is disposed downstream of the wavelength conversion element in the beam path of the light having the first spectrum. In particular, the beam path of the light having the second spectrum can also correspond to the beam path of the light having the first spectrum, such that preferably the filter layer can be disposed downstream of the wavelength conversion element also in the beam path of the light having the second spectrum.

Furthermore, the semiconductor component can comprise a light emission surface in the beam path of the light having the first spectrum and having the second spectrum. The light incident on the semiconductor component from outside can be incident on the light emission surface, in particular. The light emission surface can be disposed downstream of the filter layer, in particular. The light emission surface can be formed for example by a main surface of the filter layer which forms an outer surface of the semiconductor component. As an alternative thereto, there can be disposed downstream of the filter layer in the beam path of the emitted light an optical element, for example a light-transmissive cover, a window and/or a lens, which comprises an outer surface of the semiconductor component, said outer surface then forming the light emission surface.

In accordance with a further preferred embodiment, the filter layer is transmissive to a part of the light having the first spectrum. In particular, the light having the first spectrum which is not converted into light having the second spectrum by the wavelength conversion element can be emitted by the semiconductor component.

The fact that a first element is "positioned in a manner remote" from a second element means, in particular, that the first and second elements are spaced apart and thus spatially separated from one another. In the case of the wavelength conversion element positioned in a manner remote from the semiconductor chip, this means, in particular, that the wavelength conversion element is not applied directly on the semiconductor chip and, for example, does not form a coating of the semiconductor chip. Furthermore, this means that the wavelength conversion element is not applied indirectly on the semiconductor chip, for example by means of an adhesive layer or some other connecting layer, in order to apply the wavelength conversion element at a small distance as coating on the semiconductor chip.

In particular, the wavelength conversion element does not form a coating of the semiconductor chip and is positioned in a manner remote from the semiconductor chip if the wavelength conversion element, in accordance with one preferred embodiment, is at a distance from the semiconductor chip which corresponds to a multiple of a lateral extent of the semiconductor chip. In this case, the lateral extent of the semiconductor chip can preferably be given by an edge length of the semiconductor chip perpendicular to a growth direction and along a main extension direction of the layers of the semiconductor chip. In particular, the multiple of the lateral extent of the semiconductor chip can mean at least double, at least triple or at least five times the lateral extent of the semiconductor chip. The interspace between the semiconductor chip and the wavelength conversion element can be free of material or can be filled with a gaseous medium, for example an inert gas or air, or a gel-like or solid material, for example a potting material for the semiconductor chip, in particular a transparent plastic such as, for instance, a silicone, epoxy, acrylate, imide, carbonate, olefin or derivatives thereof. The thickness of the material between the wavelength conversion element and the semiconductor chip, which thickness above the semiconductor chip corresponds to the distance between the wavelength conversion element and the semiconductor chip, is embodied in accordance with the previous embodiments as a multiple of a lateral extent of the semiconductor chip, such that the material arranged between the wavelength conversion element and the semiconductor chip does not form a connecting layer by means of which the wavelength conversion element is applied at a small distance in the form of a coating onto the semiconductor chip. Rather, the wavelength conversion element and the semiconductor chip form two elements of the light-emitting semiconductor component which can be applied and arranged independently of one another. Such a spaced-apart arrangement of the wavelength conversion element with respect to the semiconductor chip can also be designated as a so-called "remote phosphor concept", while a wavelength conversion element which is not positioned in a manner remote from the semiconductor chip, and which is not the subject matter of the light-emitting semiconductor component described here, would come under the term "chip level coating".

In accordance with a further embodiment, the light-emitting semiconductor component comprises a carrier, on which the semiconductor chip is arranged.

The carrier can be embodied for example as a housing or carrier plate, and can preferably be based on plastic or a ceramic material. By way of example, the carrier can be embodied as a housing comprising housing material in the form of a plastic material, in which a leadframe is arranged by means of a molding process, for example. The leadframe serves for the mounting and the electrical contacting of the semiconductor chip. The semiconductor chip can be arranged for example in a depression of the housing. A potting material mentioned above, for example, can be arranged in the depression. Furthermore, it is also possible for the housing material to surround the leadframe together with the semiconductor chip. For this purpose, the semiconductor chip can be mounted and electrically contacted on the leadframe and the leadframe with the semiconductor chip can subsequently be encapsulated with the housing material.

The wavelength conversion element, carried by the carrier embodied as a housing, can be arranged in or on the housing. In particular, the wavelength conversion element can be supported on the material of the carrier and can thus be held by the carrier in a manner positioned above the semiconductor chip and remote therefrom.

Furthermore, the carrier can be embodied as a plastic or ceramic plate, for example, on which electrical contact elements in the form of conductor tracks and/or plated-through holes are present, which serve for the mounting and/or electrical contacting of the semiconductor chip. The wavelength conversion element positioned in a manner remote from the semiconductor chip can be embodied for example in the form of a self-supporting wavelength conversion element arranged as a cover, for example as a shell-shaped cover, above the semiconductor chip on the carrier. Furthermore, the carrier can comprise a supporting element which is embodied for example in the form of a frame around the semiconductor chip or as an encapsulation of the semiconductor chip and on which or in which the wavelength conversion element is arranged such that it is positioned in a manner remote from the semiconductor chip.

By way of example, the carrier can be embodied as a housing enclosing the semiconductor chip, wherein the wavelength conversion element and the filter layer are arranged on an outer side of the housing. As an alternative thereto, it is also possible for the wavelength conversion element and the filter layer or else only the wavelength conversion element to be enclosed by the housing material. If the carrier comprises a housing having a depression in which the semiconductor chip is arranged, the wavelength conversion element or the wavelength conversion element and the filter layer can be arranged in or on the depression in a manner spaced apart from the semiconductor chip. In particular, the wavelength conversion element is arranged between the semiconductor chip and the filter layer. By way of example, the wavelength conversion element is arranged in each case spatially at a distance from the semiconductor chip and from the filter layer.

In accordance with a further embodiment, the wavelength conversion element is embodied as a cover or window above the semiconductor chip. In this case, the wavelength conversion element can be embodied in a sheet- or plate-shaped fashion or else in a curved fashion, that is to say in a shell-shaped fashion. Furthermore, it is also possible for the wavelength conversion element and the filter layer together to be embodied as a cover or window above the semiconductor chip.

In particular, in the case of the embodiments described here, the wavelength conversion element is not embodied as a coating of the semiconductor chip which is applied by a sedimentation method, by an electrophoretic method, by sputtering, spraying, dispensing, ink jetting or a comparable method. Furthermore, in the case of the embodiments described here, the wavelength conversion element is also not formed by a potting of the semiconductor chip which directly surrounds and encapsulates the semiconductor chip and which contains a wavelength conversion substance.

In accordance with a further embodiment, the first spectrum comprises at least one spectral component from an ultraviolet to infrared wavelength range. Preferably, the first spectrum comprises a visible wavelength range. That can mean, in particular, that the semiconductor chip emits visible light during operation. In this case, "visible" can mean, in particular, perceptible to the human eye of an observer and can comprise a wavelength range of approximately 380 nm to approximately 800 nm. Preferably, the first spectrum comprises a blue to green wavelength range and particularly preferably a blue wavelength range.

It can be particularly advantageous if that part of the light incident on the semiconductor component from outside which is reflected by the filter layer corresponds at least partly to that partial spectrum of the light having the first spectrum which is converted by the wavelength conversion element. That can in particular also mean that the spectrum of that part of the light incident on the semiconductor component from outside which is reflected by the filter layer comprises said partial spectrum or corresponds thereto.

Therefore, it can also be possible that the filter layer at least partly reflects back the part of the light which is not converted into light having the second spectrum by the wavelength conversion element in the direction of the wavelength conversion element. For this reflected-back light there can in turn be the possibility of being at least partly converted by the wavelength conversion element. In particular, the filter layer can therefore also be suitable for increasing that part of the partial spectrum of the light having the first spectrum which is converted by the wavelength conversion element. In particular, however, it can be advantageous if the filter layer is transparent to at least one part of the light having the first spectrum, such that said part can be emitted by the semiconductor component.

Furthermore, the spectrum of that part of the light incident on the semiconductor component from outside which is reflected by the filter layer can for example comprise further spectral components of the absorption spectrum of the wavelength conversion element or comprise the absorption spectrum or correspond thereto.

In one particularly preferred embodiment, the first spectrum comprises a blue wavelength range and the second spectrum comprises a yellow wavelength range. In this case, that part of the light having the first spectrum which is converted into light having the second spectrum by the wavelength conversion element can preferably be chosen in such a way that the semiconductor component produces a white luminous impression for an observer during operation, wherein for this purpose a further part of the light having the first spectrum can also be emitted by the semiconductor component. In particular, a correspondingly suitable wavelength conversion element, in the switched-off state of the semiconductor component, in the case of light incident on the semiconductor component from outside, can produce a yellowish color impression for an observer. Therefore, the filter layer can be precisely suitable for reflecting a part of the light incident on the light emission surface of the semiconductor component from outside in such a way that, in a switched-off state, the light emission surface of the semiconductor component produces a white color impression, for example, rather than a yellowish color impression for an observer. That can be possible by virtue of the fact that the filter layer can at least partly reflect a blue spectral range of the light incident on the semiconductor component from outside.

In particular, the features and embodiments described can be advantageous for applications in which the light-emitting semiconductor component is used for instance as flash light, for instance in cell phone applications with camera. By way of example, the semiconductor component can comprise at least one blue-light-emitting semiconductor chip with a yellow-converting wavelength conversion element disposed downstream thereof. In this case, it is possible that the wavelength conversion substance is visible from outside through a transparent cover or a lens which can form the light emission surface of the semiconductor component when the light-emitting semiconductor component is not in operation, which, without the filter layer, would lead to a color impression undesirable for esthetic reasons, for example. Although such an undesirable color impression could possibly also be reduced by Fresnel optical systems or microlens arrays, a disturbing color impression usually remains in the case of such solutions.

In addition to reducing an undesirable, in particular yellow, color impression of the wavelength conversion element in a switched-off state, the filter layer, which reflects a certain proportion of the ambient light and also of the light emitted by the semiconductor chip during operation, in particular blue light, can be used for subsequently adapting the color locus of the light emitted by the light-emitting semiconductor component during operation. This can be possible particularly if the original color locus resulting from the light emitted by the light-emitting semiconductor chip and the light converted by the wavelength conversion element is shifted undesirably in the direction of the first spectrum of the light emitted by the semiconductor chip. In the case of a blue-emitting semiconductor chip and a wavelength conversion element that converts into the yellow, this is the case if the color locus emitted by the semiconductor component is shifted undesirably to the blue and thus to colder light. The filter layer can be embodied in such a way that a desired part of the unconverted light having the first spectrum that radiated through the wavelength conversion element is reflected back again into the wavelength conversion element.

As a result, the probability of conversion increases for this light and the color locus of the light emitted by the semiconductor component shifts in the direction of the second spectrum, that is to say in the direction of yellow or in the direction of warm-white light in the case of a yellow-converting wavelength conversion element.

Alternatively or additionally, the first spectrum can for example also comprise a green wavelength range and the second spectrum a red wavelength range, such that the semiconductor component can likewise enable a white luminous impression for an observer during operation. In particular, the first spectrum, the second spectrum, the partial spectrum and that part of the light incident on the semiconductor component from outside which is reflected by the filter layer can also be chosen according to a different desired color impression in each case during operation and in the switched-off state of the semiconductor component.

In a further embodiment, the semiconductor chip comprises a semiconductor layer sequence embodied as an epitaxial layer sequence, that is to say as an epitaxially grown semiconductor layer sequence. In this case, the semiconductor layer sequence can be embodied for example on the basis of an inorganic material, for instance InGaAlN. InGaAlN-based semiconductor layer sequences include, in particular, those in which the epitaxially produced semiconductor layer sequence, which generally comprises a layer sequence composed of different individual layers, contains at least one individual layer comprising a material from the III-V compound semiconductor material system $In_xAl_yGa_{1-x-y}N$ where $0 \leq x \leq 1$, $0 \leq y \leq 1$ and $x+y \leq 1$. Alternatively or additionally, the semiconductor layer sequence can also be based on InGaAlP, that is to say that the semiconductor layer sequence comprises different individual layers, at least one individual layer of which comprises a material from the III-V compound semiconductor material system $In_xAl_yGa_{1-x-y}P$ where $0 \leq x \leq 1$, $0 \leq y \leq 1$ and $x+y \leq 1$. Alternatively or additionally, the semiconductor layer sequence can also comprise other III-V compound semiconductor material systems, for example an AlGaAs-based material, or II-VI compound semiconductor material systems.

The semiconductor layer sequence can comprise as active region, for example, a conventional pn junction, a double heterostructure, a single quantum well structure (SQW structure) or a multi quantum well structure (MQW structure). Besides the active region, the semiconductor layer sequence can comprise further functional layers and functional regions, for instance p- or n-doped charge carrier transport layers, that is to say electron or hole transport layers, p- or n-doped confinement or cladding layers, buffer layers and/or electrodes and combinations thereof. Such structures concerning the active region or the further functional layers and regions are known to the person skilled in the art in particular with regard to construction, function and structure and will therefore not be explained in any greater detail at this juncture.

The semiconductor chip can furthermore comprise a substrate, on which the semiconductor layer sequence is grown or onto which the semiconductor layer sequence has been transferred after growth on a growth substrate.

By way of example, the semiconductor chip can be embodied as a thin-film semiconductor chip. A thin-film semiconductor chip can be distinguished in particular by the following characteristic features:

a reflective layer is applied or formed at a first main surface—facing toward a carrier substrate—of a light-generating semiconductor layer sequence, said reflective layer reflecting at least part of the light generated in the semiconductor layer sequence back into the latter;

the semiconductor layer sequence has a thickness in the range of 20 µm or less, in particular in the range of 10 µm; and the semiconductor layer sequence contains at least one semiconductor layer having at least one area having an intermixing structure which ideally leads to an approximately ergodic distribution of the light in the epitaxial layer sequence, that is to say that it has an as far as possible ergodically stochastic scattering behavior.

A basic principle of a thin-film semiconductor chip is described for example in the document I. Schnitzer et al., Appl. Phys. Lett. 63(16), Oct. 18, 1993, 2174-2176, the disclosure content of which in this regard is hereby incorporated by reference within the full scope.

Furthermore, it can also be possible that the semiconductor chip has a different construction and is embodied for example as a flip-chip or volume emitter known to the person skilled in the art. Furthermore, it is also possible for the semiconductor chip to be embodied as an organic semiconductor chip, in particular as an organic light-emitting diode.

In accordance with a further embodiment, the wavelength conversion element comprises at least one wavelength conversion substance. In this case, the wavelength conversion substance can comprise for example particles from the group of the cerium-doped garnets, in this case in particular cerium-doped yttrium aluminum garnet ($Y_3Al_5O_{12}$:Ce, YAG:Ce), cerium-doped terbium aluminum garnet (TAG:Ce), cerium-doped terbium-yttrium aluminum garnet (TbYAG:Ce), cerium-doped gadolinium-yttrium aluminum garnet (GdYAG:Ce) and cerium-doped gadolinium-terbium-yttrium aluminum garnet (GdTbYAG:Ce). Further possible wavelength conversion substances can be for example the following:

garnets of the rare earths and of the alkaline earth metals, as described for example in the document US 2004/062699 A1, the disclosure content of which in this regard is incorporated by reference, nitrides, sions and sialons, as described for example in the document DE 10147040 A1, the disclosure content of which in this regard is incorporated by reference, orthosilicates, sulfides and vanadates, as described for example in the document WO 00/33390 A1, the disclosure content of which in this regard is incorporated by reference, chlorosilicates, as described for example in the document DE 10036940 A1, the disclosure content of which in this regard is incorporated by reference, and aluminates, oxides, halophosphates, as described for example in the document U.S. Pat. No. 6,616,862 B2, the disclosure content of which in this regard is incorporated by reference.

Furthermore, the wavelength conversion element can also comprise suitable mixtures and combinations of the wavelength conversion substances mentioned.

Furthermore, the wavelength conversion element can comprise a transparent matrix material, wherein the wavelength conversion substance can be embedded into the matrix material or chemically bonded thereto. The transparent matrix material can comprise for example a transparent plastic, for instance silicones, epoxides, acrylates, imides, carbonates, olefins or derivatives thereof. The wavelength conversion element can be embodied for example as a self-supporting film.

Furthermore, the wavelength conversion element can also comprise a light-transmissive carrier element, which comprises for instance glass or a transparent plastic in the form of a plate, a film, a cover sheet, a shell or a window and on which the wavelength conversion substance is applied.

Furthermore, the wavelength conversion element can be embodied as a ceramic wavelength conversion element which is formed from one or a plurality of the wavelength conversion substances mentioned above or comprises one or a plurality thereof in a ceramic matrix material. A ceramic wavelength conversion element can be embodied in particular in a self-supporting fashion, for example as a ceramic lamina or ceramic plate, and have a planar or curved form in the form of a sheet or cover.

In accordance with a further embodiment, the filter layer is embodied as a dichroic mirror. In particular, for this purpose, the filter layer can comprise a periodic sequence of first and second layers. For this purpose, the layers can comprise dielectric materials, for instance oxides, nitrides and/or sulfides. In this case, the first layers can have a first refractive index and the second layers can have a second refractive index, wherein the first refractive index is different than the second refractive index. By way of example, the first layers can have a lower refractive index than the second layers and comprise silicon dioxide, for instance. The second layers can furthermore comprise a material having a higher refractive index, for instance titanium dioxide, zirconium dioxide or tantalum pentoxide. Further suitable materials can be aluminum oxide or silicon nitride, for instance. In this case, the thicknesses of the first and second layers can comprise for example approximately one quarter of the wavelength of a spectral component to be reflected. In particular, "thickness" can denote the optical path length of light in a first and respectively second layer. The thicknesses of different first layers and respectively of different second layers can be identical in this case. Alternatively or additionally, thicknesses of different first layers and respectively of different second layers can also be different. Depending on the reflectance of the filter layer that is to be obtained, said filter layer can comprise one or a plurality of pairs composed of one first and one second layer.

In a further embodiment, the filter layer can have a main surface, wherein the main surface of the filter layer can be the surface of the filter layer which faces away from the semiconductor chip and from the wavelength conversion element. Said main surface can be for example the light emission surface of the semiconductor component. The light incident on the semiconductor component from outside can form an angle with the main surface, for example. In this case, it is possible that the part of the light incident on the semiconductor component from outside is reflected by the filter layer in an angle-dependent manner.

The filter layer can comprise for example a substrate comprising glass or plastic. Furthermore, the filter layer can be applied on the wavelength conversion element, for example in the form of a coating or by means of an adhesive layer. In particular, for this purpose it can be advantageous if the wavelength conversion element is embodied in a self-supporting fashion for this purpose, for example as a film or plate in a planar or curved form. Alternatively or additionally, the wavelength conversion element can be part of a layer arrangement comprising a carrier element having two main surfaces facing away from one another, wherein a wavelength conversion substance as wavelength conversion element can be applied on one main surface and the filter layer can be applied on the other main surface.

Furthermore, the filter layer can be arranged in a manner spatially separated from the wavelength conversion element.

In accordance with a further embodiment, the semiconductor component comprises an optical device disposed downstream of the filter layer in the beam path of the emitted light. By way of example, the filter layer can be arranged on the optical device. An optical device can be for example a scattering, focusing, collimating or diffracting optical device, for example a lens or a lens system, a cover, a diffuser or a microprism structure or a combination thereof. Furthermore, the optical device can be arranged in a manner spatially separated from the wavelength conversion element.

Further advantages and advantageous embodiments and developments of the subjects according to the invention will become apparent from the exemplary embodiments described below in association with the figures.

Figure 1B:
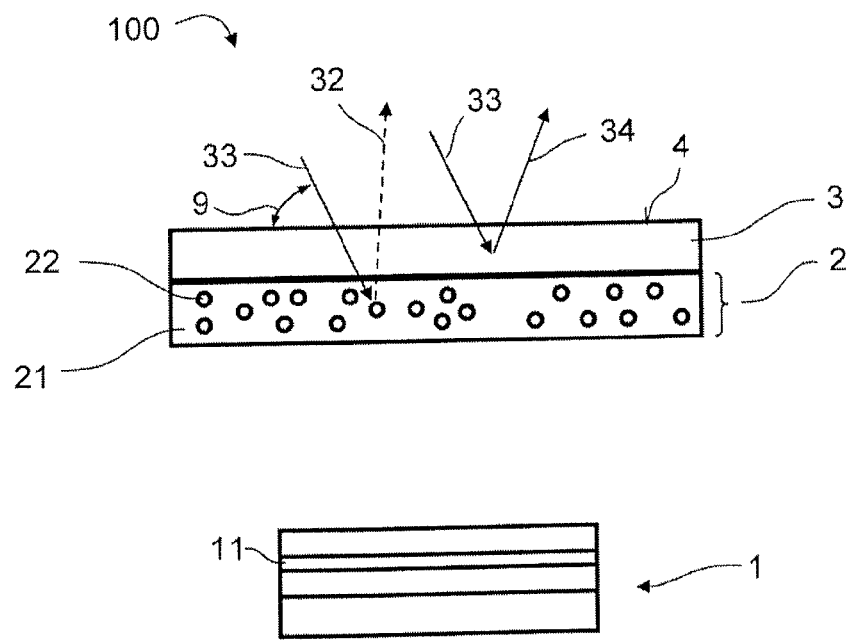
Figure 2:
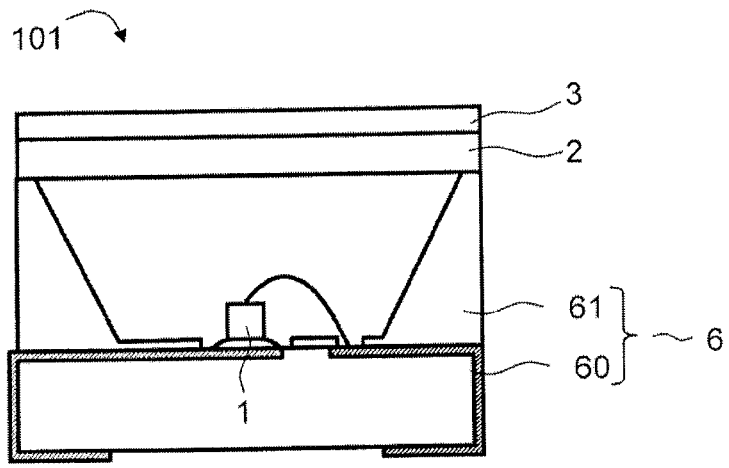
Figure 3:
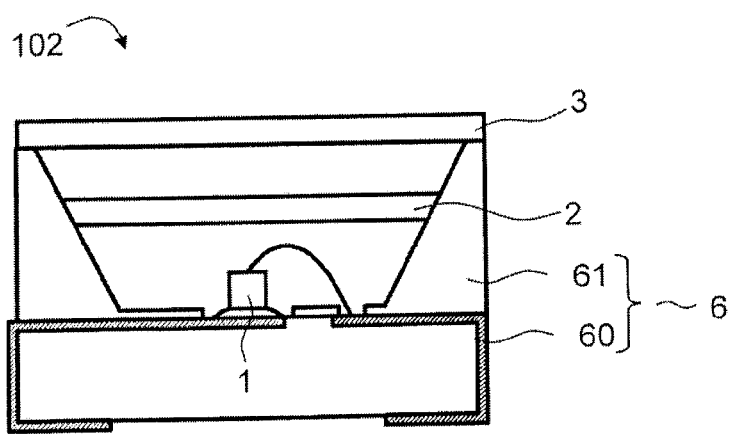
Figure 4:
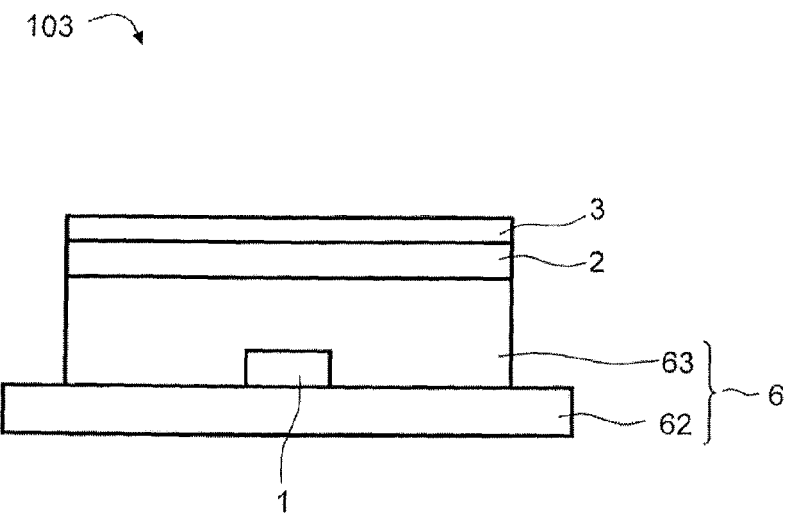
Figure 5:
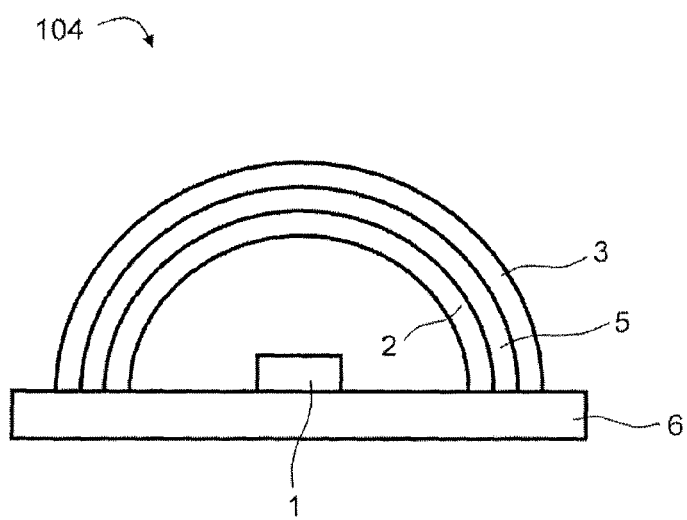

In the figures:

FIGS. 1A and 1B show schematic illustrations of a light-emitting semiconductor component in accordance with one exemplary embodiment during operation and in the switched-off state, FIG. 2 shows a schematic illustration of a light-emitting semiconductor component in accordance with a further exemplary embodiment, FIG. 3 shows a schematic illustration of a light-emitting semiconductor component in accordance with a further exemplary embodiment, FIG. 4 shows a schematic illustration of a light-emitting semiconductor component in accordance with a further exemplary embodiment, and FIG. 5 shows a schematic illustration of a light-emitting semiconductor component in accordance with a further exemplary embodiment.

In the exemplary embodiments and figures, identical or identically acting constituent parts are provided in each case with the same reference signs. The illustrated elements and their size relationships among one another should not be regarded as true to scale, in principle; rather, individual elements, such as e.g. layers, may be illustrated with exaggerated thickness in order to enable better illustration and/or in order to afford a better understanding.

FIGS. 1A and 1B show one exemplary embodiment of a light-emitting semiconductor component 100. In this case, the light-emitting semiconductor component 100 in FIG. 1A is illustrated in operation, that is to say a switched-on, light-emitting state, while the light-emitting semiconductor component 100 in FIG. 1B is shown in the switched-off state. The following description relates equally to FIGS. 1A and 1B, unless expressly indicated otherwise.

The light-emitting semiconductor component 100 comprises a light-emitting semiconductor chip 1 having an active region 11. In this case, as explained in the general part of the description, the semiconductor chip 1 can comprise a semiconductor layer sequence on a substrate. As described above in the general part, the semiconductor layer sequence can comprise functional layers or layer sequences and can comprise in particular one or a plurality of the compound semiconductor materials mentioned or else can be embodied as an organic light-emitting semiconductor chip. In particular, the active region 11 of the semiconductor chip 1 is suitable for emitting light 31 having a first spectrum during operation as is indicated in FIG. 1A.

A wavelength conversion element 2 comprising a wavelength conversion substance 22 is arranged in the beam path of the light 31 having the first spectrum. As indicated in the exemplary embodiment shown, the wavelength conversion substance 22 can be embedded in a matrix material 21, for example. The wavelength conversion element 2 can be embodied for example as a self-supporting film. Furthermore, it can also be possible that the wavelength conversion element 2 is embodied as a ceramic wavelength conversion element, that is to say for example as a ceramic lamina, which comprises a ceramic wavelength conversion substance 22 in a ceramic matrix material 21. As an alternative thereto, the wavelength conversion element 2 can for example also be formed only by a ceramic wavelength conversion substance 22.

The wavelength conversion substance 22 is suitable for at least partly converting a partial spectrum of the light 31 having the first spectrum into light 32 having a second spectrum. In this case, suitable materials for the wavelength conversion substance 22 can include, in particular, materials having an absorption spectrum which contains at least one spectral component, in particular a wavelength range, which is also contained in the first spectrum. The absorbed light can then preferably be emitted by the wavelength conversion substance 22 with a different wavelength than the light 31 having the first spectrum.

The wavelength conversion element 2 is positioned in a manner remote from the light-emitting semiconductor chip 1. As described above in the general part, this means, in particular, that the wavelength conversion element 2 is at a distance from the semiconductor chip 1, such that the wavelength conversion element 2 does not form a coating or directly adhesively bonded or laminated layer on the semiconductor chip 1, but rather is arranged in a manner spatially separated and not directly on or near the semiconductor chip 1. In particular, the light-emitting semiconductor chip 1 can have a lateral extent which corresponds for example to an edge length of the semiconductor chip 1 in a direction parallel to the main extension plane of the layers of the semiconductor chip 1 and perpendicular to a growth and arrangement direction of the layers of the semiconductor chip 1. The wavelength conversion element 2 is preferably arranged at a distance from the semiconductor chip 1 which corresponds to a multiple of the lateral extent of the semiconductor chip 1, in particular to at least double, at least triple or at least five times said lateral extent. The lateral extent of the wavelength conversion element 2, that is to say the extent of the wavelength conversion element 2 along its main extension directions, can be in particular greater than the lateral extent of the semiconductor chip 1 in order to be arranged at least for the most part or else entirely in the beam path of the light 31 having the first spectrum, which light is usually emitted in a wide angular range.

A filter layer 3 is arranged above the wavelength conversion element 2 in the beam path of the light 31 having the first spectrum and of the light 32 having the second spectrum. In this case, during operation and also in the switched-off state of the light-emitting semiconductor component 100, the filter layer 3 can be suitable for reflecting a part 34 of light 33 incident on the light-emitting semiconductor component 100 from outside, as indicated in FIG. 1B. In particular, the light 33 incident on the light-emitting semiconductor component 100 from outside can be radiated onto a main surface 4 of the filter layer 3 facing away from the wavelength conversion element 2. The main surface 4 can form for example the light emission surface of the light-emitting semiconductor component 100.

In particular, the filter layer 3 can comprise a periodic sequence of first and second layers composed of dielectric materials, wherein the first layers have a first refractive index and the second layers have a second refractive index and the first and second refractive indexes differ from one another, as explained further above in the general part.

Furthermore, the filter layer 3 can also be suitable for reflecting at least one part 312 of the light 31 having the first spectrum. In this case, that part 312 of the light 31 having the first spectrum which is reflected by the filter layer 3 can preferably be reflected back into the wavelength conversion element 2 and can be converted there into light 32 having the second spectrum by the wavelength conversion substance 21.

An arrangement of the filter layer 3 directly or at least in proximity on the wavelength conversion element 2 can be advantageous, in particular with regard to a compact design of the light-emitting semiconductor component 100 and with regard to a homogeneous color impression of the light-emitting semiconductor component 100 both during operation and in the switched-off state.

The color impression produced for an observer by the light-emitting semiconductor component 100 during operation results from the light emitted by the light emission surface. Said light can be in particular a superimposition of that part 311 of the light 31 having the first spectrum which can emerge from the light-emitting semiconductor component 100 without being converted and the light 32 having the second spectrum which is emitted by the wavelength conversion element 2. In particular, the color impression made possible depends on the relative intensities of the part 311 of the light 31 having the first spectrum and the light 32 having the second spectrum.

In a switched-off state of the light-emitting semiconductor component 100, as shown in FIG. 1B, no light 31 having the first spectrum is generated in the active layer 11 of the semiconductor chip 1. Nevertheless, it can be possible that the light-emitting semiconductor component 100 can produce a color impression for an observer, in particular upon viewing the light emission surface. That can be possible by virtue of the fact that at least one part of the light 33 incident on the light-emitting semiconductor component 100 from outside can be reflected at the wavelength conversion element 2, the filter layer 3 and/or the semiconductor chip 1. As indicated in FIG. 1B, at least one part of the light 33 which has a spectrum corresponding to the absorption spectrum of the wavelength conversion element 2 is converted into light 32 having the second spectrum in the wavelength conversion element 2 and can be emitted as converted light 32 toward the outside. This can lead to a color impression of the wavelength conversion element 2 in a switched-off state of the light-emitting semiconductor component 100, which is not desirable.

As described above, the filter layer 3 is suitable for reflecting a part 34 of the light 33 incident on the light-emitting semiconductor component 100 from outside. In particular, the spectrum of the part 34 can be chosen such that the undesirable color impression which can be brought about by the wavelength conversion element 2 alone can be avoided by the superimposition of the part 34 with the light 32 converted by the wavelength conversion element 2. In particular, the filter layer 3 can be embodied such that that part 34 of the light 33 radiated onto the light-emitting semiconductor component 100 from outside which is reflected has a spectrum containing one or a plurality of spectral components contained in the absorption spectrum of the wavelength conversion substance 22. In particular, such spectral components can also be contained in the first spectrum of the light 31 generated by the active region 11 of the semiconductor chip 1 during operation.

Furthermore, it can also be advantageous if that part 34 of the light 33 incident on the light-emitting semiconductor component 100 from outside which is reflected by the by the filter layer 3 and also that part 312 of the light 31 having the first spectrum which is reflected by the filter layer 3, that is to say the reflectance of the filter layer 3, are dependent on the angle 9 between the main surface 4 of the filter layer 3 and the direction from which the respective light is radiated onto the filter layer 3. In this regard, it can be advantageous, for example, if the reflectance is lower for small angles 9, such that light 31 having the first spectrum which impinges on the filter layer 3 at small angles 9 or light 33 impinging on the light-emitting semiconductor component 100 from outside on the filter layer 3 at small angles 9 is transmitted more easily than light at larger angles such as in the case of perpendicular incidence, for instance.

Purely by way of example, in the exemplary embodiment shown, the light 31 having the first spectrum comprises for example spectral components in a blue wavelength range. The wavelength conversion substance 22 of the wavelength conversion element 2 can be suitable for converting at least one part of the light 31 having the first spectrum, in particular spectral components from the blue wavelength range, into light 32 having a second spectrum in a yellow wavelength range. As a result, light which enables a white color impression, for example, for an observer is emitted via the light emission surface of the light-emitting semiconductor component 100.

In the switched-off state, the wavelength conversion element 2 by itself, in the case of light 33 incident from outside, for example solar radiation, or room lighting similar to daylight, can thus produce a yellowish color impression, which can be undesirable. The filter layer 3 can therefore be suitable for reflecting in particular a part 34 of the light 33 incident on the light-emitting semiconductor component 100 from outside and having spectral components in a blue wavelength range, such that a whitish color impression of the light emission surface of the light-emitting semiconductor component 100 can in turn be produced for an observer as a result of the superimposition of the yellowish color impression of the wavelength conversion element 2 and the bluish color impression of the filter layer 3.

By way of example, it can be possible that the filter layer 3 also reflects back at least part, for example 50%, of the light 31 having the first spectrum in the direction of the wavelength conversion element 2. As a result of the wavelength-dependent perception of the human eye, that is to say as a result of the photometric weighting, it can be possible, however, that in case of a reduction of the light 31 having the first spectrum in the blue wavelength range which is emitted by the light-emitting semiconductor component 100 even by 100% as a result of reflection at the filter layer 3 and a conversion into light 32 having the second spectrum in the wavelength conversion element 2, the perceived brightness is reduced only by approximately 3%.

The light-emitting semiconductor component 100 can be suitable for example as a component for a flash light for a cell phone application with camera. Furthermore, the light-emitting semiconductor component 100 can also be suitable for lighting devices.

Further exemplary embodiments are described hereinafter, the fundamental functioning of which corresponds to that of the exemplary embodiment in accordance with FIGS. 1A and 1B.

FIG. 2 shows a light-emitting semiconductor component 101 in accordance with a further exemplary embodiment, which comprises a light-emitting semiconductor chip 1 on a carrier 6 embodied as a housing. The carrier 6 comprises a leadframe 60, on which the semiconductor chip 1 is mounted or electrically connected. The leadframe 60 is encapsulated with a plastic material 61, which forms the housing body and which has a depression in which the semiconductor chip 1 is arranged. The carrier 6 can be embodied for example as a so-called "premold package".

Above the depression of the carrier 6 embodied as a housing, the wavelength conversion element 2 and the filter layer 3 are embodied as a cover of the carrier 6 and form a window and thus the light emission surface of the light-emitting semiconductor component 101.

The wavelength conversion element 2, as also described in association with FIGS. 1A and 1B, is positioned in a manner remote from the semiconductor chip 1 and is thus arranged spatially at a distance from the semiconductor chip 1. The interspace between the semiconductor chip 1 and the wavelength conversion element 2 in the depression of the carrier 6 can for example be free of material or be filled with a gas, for example air, or an inert gas. Furthermore, it can also be possible that the carrier 6 comprises in the depression a further plastic material in the form of a potting for the semiconductor chip 1, for example a silicone. The potting is embodied as transparent and does not comprise a wavelength conversion substance.

FIG. 3 shows a light-emitting semiconductor component 102 in accordance with a further exemplary embodiment, in which, in comparison with the exemplary embodiment in FIG. 2, the wavelength conversion element 2 and the filter layer 3 are arranged in a manner separated from one another. In particular, the wavelength conversion element 2 is positioned within the depression of the carrier 6 in a manner remote from the semiconductor chip 1. The wavelength conversion element is arranged between the semiconductor chip and the filter layer. Furthermore, the wavelength conversion element is arranged spatially at a distance both from the semiconductor chip and from the filter layer. The wavelength conversion element 2 can be embodied for example within a potting for the light-emitting semiconductor chip 1, for example in the form of a wavelength conversion element which is spaced apart and spatially separated with respect to the semiconductor chip 1 as a result of the introduction of a wavelength conversion substance. In this case, the potting material can also form the matrix material for the wavelength conversion substance of the wavelength conversion element 2. As an alternative thereto, it is also possible for the wavelength conversion element 2 to be embodied in a self-supporting fashion and to be introduced for example in the form of a film or a ceramic lamella into the depression of the carrier 6.

The filter layer 3 forms a cover of the carrier 6 and can be embodied for example as a Bragg reflector on a carrier element.

As an alternative to the carriers 6 provided with a depression and embodied as housings in the exemplary embodiments in FIGS. 2 and 3, the carrier 6 can also comprise a housing which encloses the semiconductor chip on all sides, wherein the filter layer 3 and the wavelength conversion element 2 can be arranged on an outer side of the carrier 6 in accordance with the exemplary embodiment in FIG. 2 or at least partly within the housing in accordance with the exemplary embodiment in FIG. 3.

FIG. 4 shows a light-emitting semiconductor component 103 in accordance with a further exemplary embodiment, which, in comparison with the two previous exemplary embodiments, comprises a carrier 6 formed by a ceramic substrate 62, on which a transparent plastic material 63 for encapsulating the semiconductor chip 1 applied on the ceramic substrate 62 is arranged. The ceramic substrate 62 can comprise conductor tracks and/or plated-through holes for electrically connecting the light-emitting semiconductor chip 1.

The wavelength conversion element 2 and the filter layer 3 are applied on an outer side of the carrier 6 that is formed by an outer side of the plastic material 63. As an alternative to the arrangement of the wavelength conversion element 2 and the filter layer 3 on only one surface of the carrier 6, they can also be applied on a plurality of surfaces of the carrier 6 and in particular of the plastic material 63, that is to say also on side surfaces of the plastic material 63 in addition to the top side shown.

FIG. 5 shows a light-emitting semiconductor component 104 in accordance with a further exemplary embodiment, which comprises a carrier 6, for example a plastic substrate or a ceramic substrate, on which a light-emitting semiconductor chip 1 is arranged and electrically contacted. Positioned at a distance and thus in a manner remote from the semiconductor chip 1, the light-emitting semiconductor component 104 comprises a shell-shaped carrier element 5, for example in the form of a glass dome or a plastic dome, which purely by way of example has on an inner side—facing the semiconductor chip 1—the wavelength conversion element 2, for example in the form of a coating with a wavelength conversion substance, and on an outer side has the filter layer 3. A cavity is formed between the carrier 6 and the wavelength conversion element 2, which cavity can be empty or can be filled with a gas. Furthermore, it is also possible for a potting material to be arranged in the cavity. As an alternative to the exemplary embodiment shown, it can also be possible that the wavelength conversion element 2 without the carrier element 5 is formed in a self-supporting fashion from a plastic or ceramic material with a wavelength conversion substance and is arranged above the semiconductor chip 1 in a dome-like manner.

The exemplary embodiments shown in the figures all show light-emitting semiconductor components which comprise a wavelength conversion element 2 in accordance with a so-called "remote phosphor concept" which is positioned in a manner remote from a light-emitting semiconductor chip 1. In this case, as described above, the wavelength conversion element 2 is embodied for example as a sheet, shell or cover. In order, in the switched-off state of the light-emitting semiconductor components shown, to avoid an undesirable, for example yellow, color impression of the wavelength conversion element 2, which can be perceived as disturbing, a filter layer 3 is arranged in each case directly on the wavelength conversion element 2 or else at a distance therefrom, said filter layer reflecting at least one part 34 of light 33 incident on the light-emitting semiconductor components from outside, in order, in the switched-off state of the semiconductor components, to superimpose and thus modify a color impression brought about in each case by the wavelength conversion element 2. Known measures such as, for example, using a white diffuser as a cover above the wavelength conversion element 2 in order to avoid a disturbing color impression of the wavelength conversion element 2 are not necessary in the case of the light-emitting semiconductor components described here, and so the disadvantages associated with such additional diffusers such as a significant loss of light, for example, can be avoided.

In accordance with further exemplary embodiments, features of the exemplary embodiments described in association with the figures can be combined with one another, even if such combinations are not explicitly described in association with the figures. Furthermore, the exemplary embodiments described in association with the figures can comprise additional or alternative features in accordance with the embodiments in the general part.

The invention is not restricted to the exemplary embodiments by the description on the basis of said exemplary embodiments. Rather, the invention encompasses any novel feature and also any combination of features, which in particular includes any combination of features in the patent claims, even if this feature or this combination itself is not explicitly specified in the patent claims or exemplary embodiments.

This patent application claims the priority of German patent applications 10 2012 109 109.9 and 10 2012 111 123.5, the disclosure content of which is hereby incorporated by reference.

The invention claimed is:

1. A light-emitting semiconductor component, comprising:
a light-emitting semiconductor chip having an active region, which emits light having a first spectrum during operation;
a wavelength conversion element, which is positioned in a manner remote from the semiconductor chip and is disposed downstream of the semiconductor chip in the beam path of the light having the first spectrum and which at least partly converts light having the first spectrum into light having a second spectrum; and
a filter layer, which reflects at least one part of light incident on the semiconductor component from outside,
wherein
that part of the light incident on the semiconductor component from outside which is reflected by the filter layer has a visible wavelength range and is superimposed on a color impression brought about by the wavelength conversion element in a switched-off state of the semiconductor component, and
the wavelength conversion element is arranged spatially at a distance from the filter layer.

2. The semiconductor component according to claim 1, comprising a carrier embodied as a housing, wherein
the housing has a depression,
the semiconductor chip and the wavelength conversion element are arranged within the depression, and
the filter layer is arranged above the depression as a cover of the carrier.

3. The semiconductor component according to claim 1, wherein the wavelength conversion element is at a distance from the semiconductor chip which corresponds to a multiple of a lateral extent of the semiconductor chip.

4. The semiconductor component according to claim 1, wherein the semiconductor component comprises a carrier, on which the semiconductor chip is arranged and which carries the wavelength conversion element arranged in a manner remote from the semiconductor chip.

5. The semiconductor component according to claim 4, wherein
the wavelength conversion element is embodied as a cover, window or shell above the semiconductor chip, or
the wavelength conversion element and the filter layer are embodied as a cover, window or shell above the semiconductor chip.

6. The semiconductor component according to claim 1, wherein the filter layer is disposed downstream of the wavelength conversion element in the beam path of the light having the first spectrum.

7. The semiconductor component according to claim 6, wherein
the semiconductor component comprises a light emission surface disposed downstream of the filter layer, and
the light incident on the semiconductor component from outside is radiated onto the light emission surface.

8. The semiconductor component according to claim 1, wherein the first spectrum comprises a visible wavelength range.

9. The semiconductor component according to claim 1, wherein that part of the light incident on the semiconductor component from outside which is reflected by the filter layer corresponds at least partly to that partial spectrum of the light having the first spectrum which is converted by the wavelength conversion element.

10. The semiconductor component according to claim 1, wherein the filter layer is transparent to a part of the light having the first spectrum.

11. The semiconductor component according to claim 1, wherein
the first spectrum comprises a blue wavelength range and the second spectrum comprises a yellow wavelength range,
the semiconductor component comprises a light emission surface disposed downstream of the filter layer, and
the light emission surface produces a non-yellowish color impression for an observer in a switched-off state.

12. The semiconductor component according to claim 1, wherein the wavelength conversion element is embodied as a ceramic wavelength conversion element.

13. The semiconductor component according to claim 1, wherein the wavelength conversion element comprises a wavelength conversion substance in a matrix material and the matrix material comprises a transparent plastic.

14. The semiconductor component according to claim 13, wherein the wavelength conversion element is embodied as a self-supporting film.

15. The semiconductor component according to claim 1, wherein the wavelength conversion element comprises a carrier element, on which a wavelength conversion substance is applied, and the carrier element comprises glass or plastic.

16. The semiconductor component according to claim 1, wherein
the filter layer is embodied as a dichroic mirror comprising a periodic sequence of first layers and second layers,
the first layers have a first refractive index and the second layers have a second refractive index, which is different than the first refractive index, and
the first layers and the second layers of the filter layer in each case comprise an oxide or nitride.

17. The semiconductor component according to claim 1, wherein the filter layer is applied on the wavelength conversion element.

18. The semiconductor component according to claim 1, wherein
the filter layer comprises at least one main surface facing away from the wavelength conversion element,
the light incident on the semiconductor component from outside is radiated onto the main surface at an angle, and the part of the light incident on the semiconductor component from outside is reflected by the filter layer in a manner dependent on said angle.

19. The semiconductor component according to claim 1, wherein the wavelength conversion element and the filter layer are embodied as a shell above the semiconductor chip.

20. A light-emitting semiconductor component, comprising:
a light-emitting semiconductor chip having an active region, which emits light having a first spectrum during operation;
a carrier embodied as a housing;
a wavelength conversion element, which is positioned remote from the semiconductor chip and is configured to convert light having the first spectrum into light having a second spectrum; and
a filter layer which is configured to reflect one part of light incident on the semiconductor component from outside, wherein the filter layer is configured in such a way that the reflected part has a spectrum containing one or a plurality of spectral components contained in an absorption spectrum of a wavelength conversion substance of the wavelength conversion element,
wherein
the housing has a depression,
the filter layer is arranged above the depression as a cover of the carrier,
the semiconductor chip and the wavelength conversion element are arranged within the depression, and
the wavelength conversion element is embodied as a self-supporting film and is arranged spatially at a distance from the filter layer.

* * * * *